United States Patent [19]

Yoneyama

[11] 4,366,468

[45] Dec. 28, 1982

[54] CHARGE-BALANCED ANALOG-TO-DIGITAL CONVERTER

[75] Inventor: Toshikazu Yoneyama, Tsurugashima, Japan

[73] Assignee: Toko, Inc., Tokyo, Japan

[21] Appl. No.: 166,809

[22] Filed: Jul. 9, 1980

[30] Foreign Application Priority Data

Jul. 16, 1979 [JP] Japan ................................. 54-90123

[51] Int. Cl.³ ............................................ H03K 13/20
[52] U.S. Cl. ...................... 340/347 NT; 340/347 AD; 340/347 M
[58] Field of Search .... 340/347 M, 347 NT, 347 AD; 324/99 D

[56] References Cited

U.S. PATENT DOCUMENTS

| | | | |
|---|---|---|---|
| 4,063,236 | 12/1977 | Amemiya et al. | 340/347 NT |
| 4,195,283 | 3/1980 | Ishikawa | 340/347 NT |
| 4,217,543 | 8/1980 | Strong | 340/347 NT |
| 4,243,975 | 1/1981 | Masuda et al. | 340/347 NT |

Primary Examiner—T. J. Sloyan

[57] ABSTRACT

A charge-balanced analog-to-digital converter including an integrator, a capacitor, two counters and a control circuit. The integrator has two input terminals which are connected to an operational amplifier through separate resistors respectively. One of the input terminals is provided, during a first cyclic period, with a lower potential version of input voltage and during a second cyclic period, with a higher potential version of the input voltage. The other input terminal is provided, during the first and second cyclic periods, alternately with a reference voltage for charging the capacitor and an earth voltage for causing the integrator to be discharged, by discriminating the output of the integrator by means of the comparator. Clock signals which occur during the first and second cyclic periods are counted by one of the two counters, and clock signals which occur when the integrator is being charged during the first and second cyclic periods, are counted by way of summation and reduction by means of the other counter.

2 Claims, 4 Drawing Figures

1

CHARGE-BALANCED ANALOG-TO-DIGITAL CONVERTER

This invention relates to a charge-balanced type analog-to-digital converter (referred to as AD converter hereinafter) which is designed not to be adversely influenced by offset voltage of an integrator incorporated therein.

AD converters most commonly employed for low-speed purposes are of the dual slope type; recently, however, charge-balanced type AD converters have been put to practical use. As compared with the dual slope type, the charge-balanced type is complex in terms of circuit arrangement, but problems tending to arise from such circuit-wise complexity have substantially been solved by means of large-scale integrated circuit techniques. And yet, the charge-balanced type is advantageous in that requirements imposed upon externally attached components are lenient and that performance of the analog circuit system employed therewith does not have to be specially high.

In order for the AD converter of the present invention to be well understood, description will first be made of the prior-art charge-balanced AD converter.

Although the aforementioned AD converter of the charge-balanced type is more complex in terms of circuit arrangement than the conventional double-integration type AD converter since it requires two series of counters, it has many advantages, among others, as follows:

(1) The conversion time is constant so that synchronism with external circuits can be easily achieved;
(2) The conversion speed is high;
(3) Clock signal jitter causes no error;
(4) Dielectric absorption in the integration capacitor raises no problems; and
(5) The dynamic range of the integrator may be narrow.

With the conventional charge-balanced type AD converter, there is the tendency that errors are caused to occur in conversion by the occurrence of an offset voltage in the operational amplifier constituting the integrator; thus, in order to cope with this, there has conventionally been adopted such a system that an auto-zero time is given prior to conversion so that the offset voltage is made to be charged at a capacitor and the offset voltage thus charged is cancelled during the operation of conversion. With such a system, it is required that no variations occur in the voltage charged at the offset voltage charging capacitor, and accordingly that such a capacitor be of high capacitance and less leakage. In practice, however, the voltage charged at such a capacitor tends to leak from printed circuit boards and even from analog switches incorporated in integrated circuits. Such leakage is likely to occur especially in a high-temperature and high-humidity environment. Obviously, this makes it impossible to achieve analog-to-digital conversion with high accuracy.

Accordingly, it is an object of this invention to provide a charge-balanced type AD converter which is so designed as to compensate for adverse influence of offset voltage in a digital way which eliminates the necessity of employing any capacitor for being charged with offset voltage, and thereby to obviate the aforementioned drawbacks of the prior-art techniques.

Briefly stated, the AD converter according to the present invention comprises an integrator which is provided with a bias voltage; a comparator; two counters; and a control circuit. The present AD converter is characterized in that the integrator has two input terminals which are connected to an operational amplifier through separate resistors respectively, wherein one the two input terminals is provided, during a first cyclic period, with a lower potential version of the input voltage to be subjected to conversion and during a second cyclic period, with a higher potential version of the input voltage to be subjected to conversion, while the other input terminal is provided, during the first and second cyclic periods, alternately with a reference voltage for charging the capacitor and an earth voltage for causing the integrator to be discharged, by discriminating the output of the integrator by means of the comparator, and wherein clock signals which occur during the first and second cyclic periods which are equal to each other, are counted by one of the two counters, and clock signals which occur when the integrator is being charged during the first and second cyclic periods, are counted by way of summation and reduction by means of the other counter.

Other objects, features and adantages of the present invention will become apparent from the ensuing description taken in conjunction with the accompanying drawings.

Figure 1:
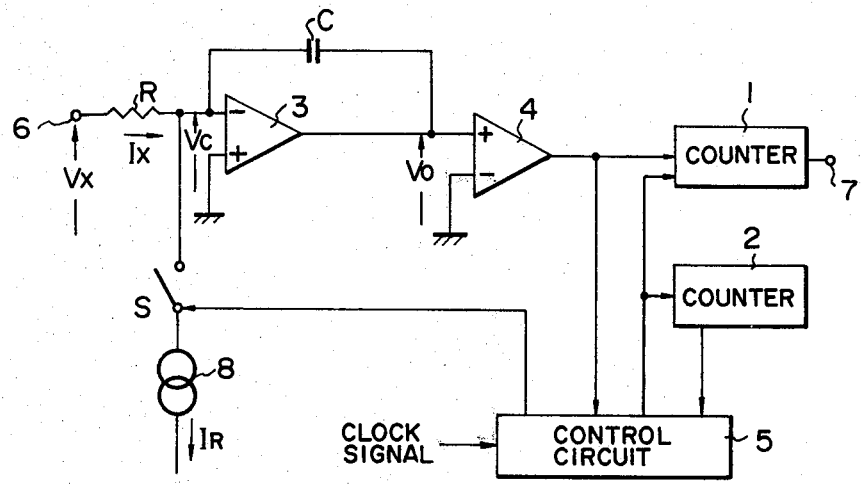
FIG. 1 is a schematic circuit diagram showing the conventional charge-balanced type AD converter.
Figure 2:
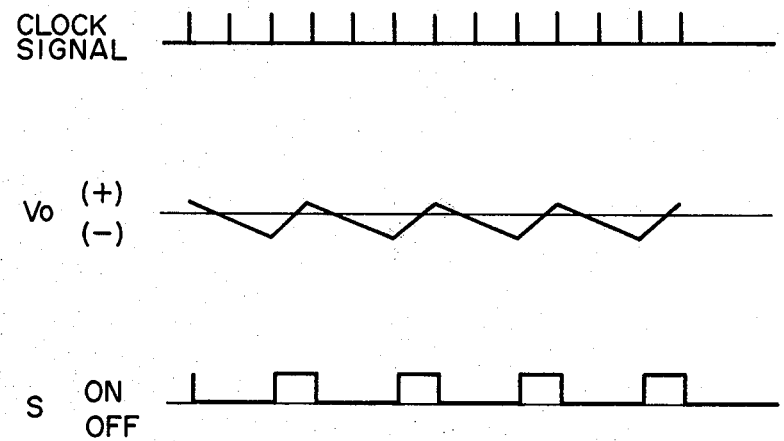
FIG. 2 is a view showing voltage waveforms which occur in the circuit arrangement shown in FIG. 1.

FIG. 1 shows the circuit arrangement of the prior-art AD converter of the charge-balanced type, and FIG. 2 illustrates voltage waveforms which occur therein. The AD converter shown in FIG. 1 comprises counters 1 and 2, an operational amplifier 3, a comparator 4, a control circuit 5, an input terminal 6, an output terminal 7, and a constant current source 8. In this figure, R and C are a resistor and capacitor, representing the values of these two elements respectively. As will readily be understood, the resistor R, capacitor C and operational amplifier 3 constitute an integrator with a time constant defined by the resistor R and capacitor C. There is provided a switch S.

With the switch S turned off, if an input voltage $V_X$ to be subjected to conversion is applied to the input terminal 6, then a current $I_X$ which is equal to $V_X/R$ is caused to flow through the aforementioned integrator, as a result of which the output voltage Vo of the integrator will drop. If the output voltage Vo drops to be negative (—indication), then this will be detected by the comparator 4 and then transmitted to the control circuit 5 which will in turn provide a signal by which the switch S will be turned on. If reference current $I_R$ of the constant current circuit 8 is higher than the aforementioned current $I_X$, then the input current $(I_X - I_R)$ will become negative, as a result of which the output voltage Vo of the integrator will build up.

When the output voltage Vo becomes positive, the switch S will be turned off by a signal derived from the control circuit 5. FIG. 2 illustrates the case where the switch S is turned on each time three clock signals occur. Input voltage $V_X$ varies in dependence on the number of clock signals by which the switch S is turned on.

Under a charge-balanced condition, the total sum of the charge current in the integrator equals to that of discharge currents therein. Assuming that the total number of clock signals which occur when the switch S is in "on" state is N1 and that the total number of clock signals which occur during conversion time is N2, then the total sum of the reference current $I_R$ is represented by $I_R \cdot N1/N2$ which is equal to the current $I_X$. Thus, the following relationship holds true: $V_X = R \cdot I_X = I_R \cdot R \cdot N1/N2$. Accordingly, N1 represents the digital conversion value.

A more detailed description will now be made of the present invention with respect to the embodiment shown in FIG. 3 in which parts corresponding to those of FIG. 1 are indicated by like reference numerals and symbols.

Figure 3:
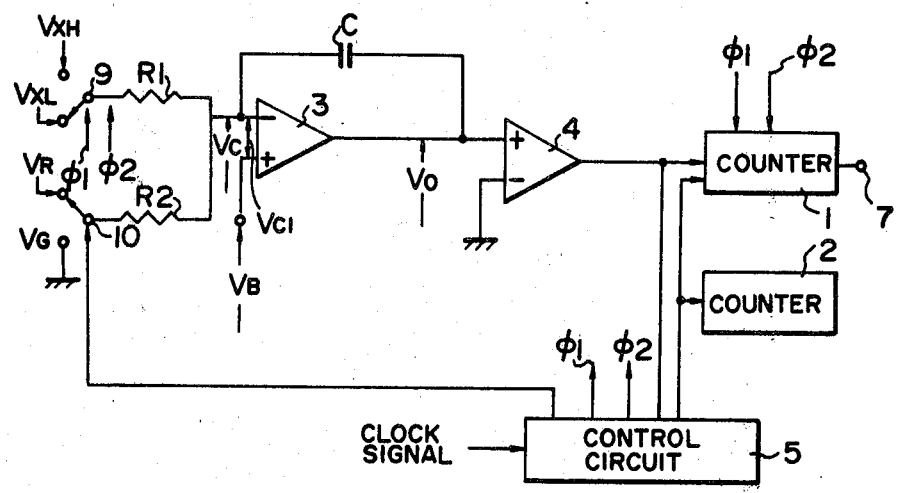
FIG. 3 is a schematic circuit diagram showing the charged-balanced AD converter according to an embodiment of the present invention.

Referring to FIG. 3, there is provided an integrator which comprises resistors R1 and R2, a capacitor C and an operational amplifier 3. The integrator has two input terminals 9 and 10 which are connected to the inverting input terminal of the operational amplifier through the resistors R1 and R2 respectively. The resistors R1 and R2 and capacitor C serve to define the time constant of the integrator, R1, R2 and C also representing the values of these elements, respectively. A bias voltage $V_B$ is applied to the non-inverting input terminal of the operational amplifier 3. The output of the operational amplifier 3 is connected to the non-inverting input terminal of the comparator 4, the inverting input terminal of which is grounded.

Control circuit 5 is responsive to a signal derived from the comparator 4 to effect switching operation by which either the reference voltage $V_R$ or earth voltage $V_G$ is applied to the input terminal 10. The control circuit 5 is also so designed as to effect switching operation by which the lower and higher potential versions of input voltage to be converted are switchingly applied to the input terminal 9 during the first cyclic period $\phi 1$ and second cyclic period $\phi 2$. Furthermore, the control circuit 5 is arranged to make the counter 1 operate as an up-counter during the first cyclic period $\phi 1$ and as a down-counter during the second cyclic period $\phi 2$.

Figure 4:
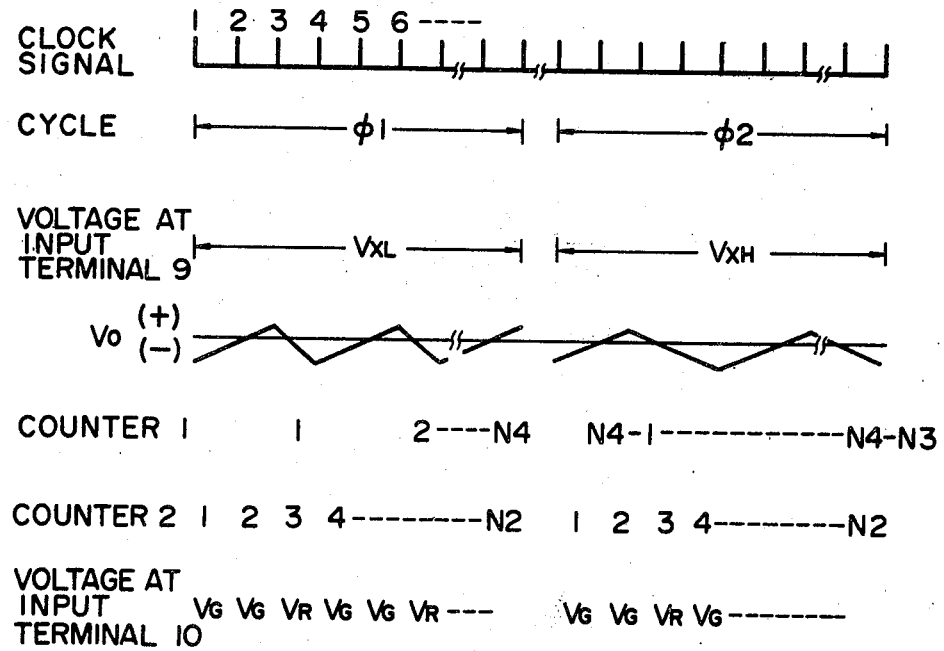
FIG. 4 is a view showing states in various portions of the circuit arrangement shown in FIG. 3 which occur during operation.

The operation of the present AD converter having the aforementioned arrangement will be explained with reference to FIG. 4 showing the states which occur in the various portions of the converter during the operation thereof.

First of all, during the first cyclic period $\phi 1$, the lower potential version $V_{XL}$ of input voltage is applied to the input terminal 9. In such a case, if earth voltage $V_G$ is applied to the input terminal 10, then the capacitor C will be discharged so that the output voltage Vo of the integrator will build up. When the output voltage becomes positive (+indication), this will be discriminated by the comparator 4, as a result of which the reference voltage $V_R$ will be applied to the input terminal 10 through the control circuit 5 so that the capacitor C will be charged. In FIG. 4, such a state corresponds to the time when clock signal 3 occurs, for example. When the output voltage Vo of the integrator drops to be negative (−indication), the input terminal 10 will be provided with earth voltage $V_G$ so that the output voltage of the integrator will once again be caused to build up. In FIG. 4, this state corresponds to the time when clock signal 4 occurs. Under a balanced condition, the same operation will be repeated; thus, the number of clock signals occurring during the first cyclic period will be counted by the counter 2, while the number of clock signals which occur during the time which the capacitor is charged, i.e., the charging time of the integrator, will be counted by the counter 1.

When the count of the counter 2 becomes N2, the first cyclic period $\phi 1$ will terminate, and when the count of the counter 1 becomes N4, the following equation will hold true:

$$\frac{V_C - V_{XL}}{R1} + \frac{V_C}{R2} \times \frac{N2 - N4}{N2} = \frac{V_R - V_C}{R2} \times \frac{N4}{N2} \quad (1)$$

where $V_C$ indicates the voltage at the inverting input terminal of the operational amplifier 3.

During the second cyclic period $\phi 2$, the input terminal 9 will be provided with the higher potential version $V_{XH}$ of the input voltage, with the input terminal 10 being alternately provided with the reference voltage $V_R$ and earth voltage $V_G$ as is the case with the first cyclic period $\phi 1$. The counter 2 is cleared and permitted to count the number of clock signals which occur during the second cyclic period. The counter 1 is arranged to count the number of clock signals which occur during the charging period of the integrator during both the first and second cyclic periods, but the counter 1 is not cleared irrespective of termination of the first cyclic period and is made to operate as a down-counter during the second cyclic period. When the count of the counter 2 becomes N2 which is the count thereof at the end of the first cyclic period, the second cyclic period will terminate. At this point, if the count of the counter 1 is reduced by N3, then the following equation (2) will hold true:

$$\frac{V_C - V_{XH}}{R1} + \frac{V_C}{R2} \times \frac{N2 - N3}{N2} = \frac{V_R - V_C}{R2} \times \frac{N3}{N2} \quad (2)$$

By subtracting the both sides of the equation (2) from those of the equation (1), the following equation (3) is obtained:

$$V_{XH} - V_{XL} = \frac{R1}{R2} \times \frac{N4 - N3}{N2} \times V_R \quad (3)$$

The left hand side of the equation (3) represents the input voltage to be subjected to conversion, and $N4-N3$ indicates the count value which is obtained in the counter 1 when the second cyclic period $\phi 2$ terminates. In this way, the count value of the counter 1 when the second cyclic period $\phi 2$ terminates, turns out to be the digital conversion value.

It is required that the voltage $V_C$ at the negative input terminal of the operational amplifier 3 be set up so that the integrator is charged when the reference voltage $V_R$ is applied to the input terminal 10, whereas when the earth voltage $V_G$ is applied thereto, the integrator is discharged. To this end, bias voltage $V_B$ is applied to the positive input terminal of the operational amplifier 3.

In the case of a common 3½-digit type digital voltmeter, for example, assuming that the input voltage ranges form −2 V to +2 V, the following equations (4) and (5) can be set up:

$$\frac{R2}{R1 + R2} \times V_{iMAX} = \frac{R2}{R1 + R2} 2 < V_C \quad (4)$$

-continued $$\frac{R1}{R1 + R2} \times V_R + \frac{R2}{R1 + R2} \times V_{iMIN} = \quad (5)$$

$$\frac{R1}{R1 + R2} V_R - \frac{R2}{R1 + R2} \times 2 > V_C$$

where $V_{iMAX}$ and $V_{iMIN}$ indicates the maximum and minimum values of the input voltage to be subjected to conversion, respectively.

When the input voltage, or $V_{XH}-V_{XL}$ is 1 V, this sets up such a relationship as $N4-N3=1000$; thus, from the equation (3), the following equation (6) can be obtained:

$$R1 = \frac{1}{V_R} \times \frac{N2}{1000} \times R2 \quad (6)$$

By substituting the R1 in the equations (4) and (5) with the equation (6), the following equations (7) and (8) can be obtained:

$$N2 > 4000 \quad (7)$$
$$\frac{2 V_R}{K + V_R} < V_C < \frac{(K - 2) V_R}{K + V_R} \quad (8)$$

where $K=N2/1000$. It will be seen that by increasing N2, the conversion time is delayed while the tolerance range of the voltage $V_C$ becomes wider. With $N2=8000$ and $V_R=2$ V, the voltage $V_C$ may be in the range of 0.4 V$<V_C<$1.2 V. With an arrangement that bias voltage $V_B$ of about 0.8 V is obtained by dividing the reference voltage $V_R$, such a tolerance range of the voltage $V_C$ may suffice even when errors in the resistors constituting the divider circuit and dispersion of the offset voltage are taken into account.

From the foregoing discussion, it will be appreciated that with the construction of AD converter according to the present invention, the voltage $V_C$ at the negative input terminal of the operational amplifier 3 which includes offset voltage $V_{C1}$ and bias voltage $V_B$, though it is contained in the equations (1) and (2), is not contained in equation (3) as the result of having been cancelled out. Consequently, according to the present invention, the offset voltage $V_{C1}$ and bias voltage $V_B$ are cancelled out together in a digital way, and thus such voltages constitute no cause for errors which would otherwise occur. In the case where there exists leakage through the capacitor C, a leakage current $I_e$ will additionally be included in the left hand side of the equations (1) and (2), but no such leakage current will be contained in the equation (3). By virtue of this fact, therefore, no errors will be caused even if the voltage at the capacitor C is caused to leak for the aforementioned various reasons. In addition, the present arrangement is also highly advantageous in that there is no necessity that the lower potential version of the input voltage be grounded.

As will be appreciated, according to the present invention, it is possible to achieve much more precise conversion than that achieved by employing the prior-art charge-balanced AD converters.

While the present invention has been described and illustrated with respect to a specific embodiment thereof, it is to be understood that the present invention is by no means limited to such specific embodiment, and therefore that various modifications and/or changes which will become possible within the spirit of the invention and the appended claims constitute part of the present invention.

What is claimed is:

1. A charge-balanced analog-to-digital converter, comprising an integrator including a capacitor, two separate resistors, an operational amplifier, and first and second input terminals connected to the inverting input terminal of said operational amplifier through said two separate resistors respectively; a comparator; first and second counters; and, a control circuit, responsive to the output of said comparator for providing said first input terminal during a first cyclic period, with the lower potential version of an input voltage to be subjected to analog-to-digital conversion and during a second cyclic period, with the higher potential version of said input voltage, and for providing said second input terminal during both the first and second cyclic periods, alternately with a reference voltage for charging said capacitor and a ground potential for causing said capacitor to be discharged; said second counter being arranged to count clock signals occuring during said first and second cyclic periods, for making said first and second cyclic periods equal to each other; said first counter being arranged to count up, during said first cyclic period, those ones of said clock signals which occur when said capacitor is being charged and count down said those ones of said clock signals during said second cyclic periods; the values counted during the first and second periods are deducted so as to be converted to a digital signal in said first counter whereby said unknown input voltage is subjected to analog-to-digital conversion.

2. A charge-balanced analog-to-digital converter, comprising a first and a second input terminal; an output terminal; a first switch means connected to said first input terminal arranged to switch between the higher potential version and the lower potential version of an unknown input voltage; a second switch means connected to said second input terminal arranged to alternately switch between a reference voltage and a ground potential; an integrator including integration resistors connected to said first and second input terminals respectively, an operational amplifier having an inverting input terminal to which said resistors are connected at the other ends thereof, and a bias voltage source connected to the non-inverting input terminal of said operational amplifier; a comparator adapted for zero-detection of the output voltage of said integrator; a first and a second counter; and a control circuit including means for setting first and second cyclic periods which are equal to each other, and for enabling the lower potential version of said unknown input voltage to be supplied to said first input terminal during the first conversion cyclic period and enabling the higher potential version of said unknown input voltage to be supplied to said first input terminal during second conversion cyclic period, said control circuit further including means for actuating said second switch means in accordance with a signal resulting from the zero potential detection effected by said comparator so that the reference voltage and ground potential are alternately imparted to said second input terminal during the first and second conversion cyclic periods, thereby causing said integrator to be charged and discharged, wherein clock pulses occurring during the first and second cyclic period are counted by said second counter; clock pulses occurring while the integrator is being charged are counted by said first counter; the values counted during the first and second periods are deducted so as to be converted to a digital signal in said first counter, whereby said unknown input voltage is subjected to analog-to-digital conversion.

* * * * *